US006638853B1

(12) United States Patent
Sue et al.

(10) Patent No.: US 6,638,853 B1
(45) Date of Patent: Oct. 28, 2003

(54) METHOD FOR AVOIDING PHOTORESIST RESIST RESIDUE ON SEMIOCONDUCTOR FEATURE SIDEWALLS

(75) Inventors: Hung-Wen Sue, Jubei (TW); Chung-Shi Liu, Hsin-chu (TW); Wen-Chin Chiou, Maioli (TW); Keng-Chu Lin, Ping-Tung (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/190,148

(22) Filed: Jul. 3, 2002

(51) Int. Cl.[7] .......................................... H01L 21/4763
(52) U.S. Cl. ...................... 438/633; 438/642; 438/637; 438/640; 438/673
(58) Field of Search ..................... 438/633, 637–640, 438/672–673, 675, 692

(56) References Cited

U.S. PATENT DOCUMENTS 6,143,646 A * 11/2000 Wetzel .......................... 347/20
6,287,972 B1 * 9/2001 Ziger et al. ................. 438/637
6,372,616 B1 * 4/2002 Yoo et al. ................... 438/592
6,420,441 B1 * 7/2002 Allen et al. ............. 204/192.32
6,455,416 B1 * 9/2002 Subramanian et al. ...... 438/637

* cited by examiner

Primary Examiner—Carl Whitehead, Jr.
Assistant Examiner—Thanh Nguyen
(74) Attorney, Agent, or Firm—Tung & Associates

(57) ABSTRACT

A method for improving a photolithographic patterning process to avoid undeveloped photoresist contamination in a semiconductor manufacturing process including providing a semiconductor wafer having a process surface including a first anisotropically etched opening extending through a semiconductor wafer thickness portion including an underlying dielectric insulating layer; blanket depositing a polymeric resinous layer over the semiconductor wafer process surface to include filling the first anisotropically etched opening; curing the polymeric resinous layer by exposing the polymeric resinous layer to at least one of thermal or photonic energy to initiate polymer cross linking; chemically mechanically polishing (CMP) the polymeric resinous layer to substantially remove the polymeric resinous layer thickness above the process surface; and, forming a photolithographically patterned photoresist layer over the process surface for forming a second anisotropically etched opening overlying and encompassing the first anisotropically etched opening.

19 Claims, 2 Drawing Sheets

METHOD FOR AVOIDING PHOTORESIST RESIST RESIDUE ON SEMICONDUCTOR FEATURE SIDEWALLS

FIELD OF THE INVENTION

This invention generally relates to photolithographic patterning of semiconductor features and more particularly to an improved method for manufacturing semiconductor features such as via-first dual damascene structures while eliminating problems caused by photoresist residue contamination including undeveloped photoresist on via sidewalls.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to eliminate photoresist interfering effects occurring in the semiconductor wafer manufacturing process.

In the fabrication of semiconductor devices multiple levels may be required for providing a multi-level interconnect structure. During the manufacture of integrated circuits it is common to place material photoresist on top of a semiconductor wafer in desired patterns and to anisotropically etch away or otherwise remove surrounding material not covered by the resist pattern in order to produce metal interconnect lines or other desired features. During the formation of semiconductor devices it is often required that the conductive layers be interconnected through conduits in an insulating layer. Such conduits are subsequently filled with metal and commonly referred to as vias, which extend through an insulating layer between two conductive areas. Metal interconnecting lines (trench lines) are typically formed over the vias to electrically interconnect the various semiconductor devices within and between multiple levels. The damascene process is a well known semiconductor fabrication method for forming electrical interconnects between levels by forming vias and trench lines.

For example, in an exemplary process for forming dual damascene structures, a via opening is first anisotropically etched in an insulating layer also known as an inter-metal dielectric (IMD) layer. The insulating layer is typically formed over a metal or conductive area including an overlying lining or etching stop layer. After a series of photolithographic and anisotropic etching steps forming a respective via opening and overlying trench opening encompassing the via opening, the via opening and the trench opening are filled with a metal (e.g., Al, Cu) to form via and trench line portions of a dual damascene structure. The excess metal above the trench level is then removed by well known chemical-mechanical polishing (CMP) processes.

As feature sizes in anisotropic etching process have diminished, photolithographic patterning processes require activating light (radiation) of increasingly smaller wavelength. Increasingly, deep ultraviolet (DUV) photoresists with activating light source wavelengths of less than about 250 nm, for example, from about 193 nm to about 248 nm are used. Exemplary DUV photoresists, for example, include PMMA and polybutene sulfone.

One problem affecting DUV photoresist processes has been the interference of residual nitrogen-containing species, for example amides, with the DUV photoresist. Residual nitrogen-containing contamination is one of the greater concerns in the use of metal nitride layers such as silicon nitride and silicon oxynitride and metal carbide layers such as silicon carbide. For example, such layers are frequently used as a etching stop layers and silicon oxynitride as a dielectric anti-reflectance coating (DARC). The nitride layers are frequently formed by CVD process using amine and amide containing precursors which tend to diffuse into adjacent porous layers. For example, the increasing use of low-k dielectric materials, typically having a high degree of porosity, facilitates absorption and transport of contaminating chemical species. For example, it is believed that nitrogen radicals created due to the presence of nitrogen containing species, such as amines and amides, interfere with chemically amplified photoresists, for example DUV photoresists, by neutralizing the acid catalyst, thereby rendering the contaminated portion of the photoresist insoluble in the developer. As a result, residual photoresist may remain on patterned feature edges, sidewalls, or floors of features, affecting subsequent etching or metal filling processes leading to, for example, electrical open circuits or increased resistivity.

In a via-first dual damascene process, a method is disclosed for forming a via plug at least partially filling the via opening in commonly assigned co-pending application Ser. No. 10/035,690, filed Nov. 8, 2001, which is incorporated herein by reference. For example, following formation of a via opening, a via plug of polymeric material is formed by depositing an resinous layer, for example an I-line resin, to fill the via opening. The via plug is formed to at least partially fill the via opening by a plasma etch back process of the resinous layer. The via plug is intended to prevent out diffusion of contaminating species from the IMD layer to contaminate subsequently deposited DUV photoresist for trench line opening patterning. A shortcoming of the etch-back process is the difficulty in forming a via plug fully filling the via opening due to the difficulty in determining etching endpoint thereby frequently forming a partially filled via opening. Another shortcoming is the via sidewalls may be damaged during the etchback process. For example, the DUV photoresist layer used for patterning the trench openings, fills the upper portion of the via opening and forms an undeveloped photoresist residue layer along a portion of the sidewalls above the via plug of the via opening during the photolithographic patterning process. The photoresist residue is believed to be caused by contaminating chemical interference (e.g., amides or amines) with the DUV photoresist exposure and development process. As a result, the upper portions of the via sidewalls above the via plug are contaminated with an undeveloped photoresist residue layer, also referred to as photoresist poisoning, which subsequently detrimentally affects etching profiles, for example, in etching the trench portion of the dual damascene structure. Consequently, subsequent metal filling processes for filling the dual damascene structure with metal, for example copper, results in poor step coverage. As a result, areas of high electrical resistance are formed thereby leading to electrical reliability problems in semiconductor devices including the formation of open circuits.

Other approaches to prevent the diffusion of contaminating nitrogen containing species from overlying etching stop or DARC layers including for example silicon oxynitride, include forming a silicon dioxide layer over the low dielectric constant IMD layer prior to forming the etching stop or DARC layers. A shortcoming of this approach is the added stresses applied to the IMD layer and the added contribution to the overall capacitance of the multi-level semiconductor device.

There is therefore a need to develop a method whereby reliable photolithographic processes may be carried out without the detrimental effects of photoresist poisoning.

It is therefore an object of the invention to provide a method in the semiconductor processing art whereby reliable photolithographic processes may be carried out without the detrimental effects of photoresist poisoning while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for improving a photolithographic patterning process to avoid undeveloped photoresist contamination in a semiconductor manufacturing process.

In a first embodiment, the method includes providing a semiconductor wafer having a process surface including a first anisotropically etched opening extending through a semiconductor wafer thickness portion including an underlying dielectric insulating layer; blanket depositing a polymeric resinous layer over the semiconductor wafer process surface to include filling the first anisotropically etched opening; curing the polymeric resinous layer by exposing the polymeric resinous layer to at least one of thermal or photonic energy to initiate polymer cross linking; chemically mechanically polishing (CMP) the polymeric resinous layer to substantially remove the polymeric resinous layer thickness above the process surface; and, forming a photolithographically patterned photoresist layer over the process surface for forming a second anisotropically etched opening overlying and encompassing the first anisotropically etched opening.

These and other embodiments, aspects and features of the invention will become better understood from a detailed description of the preferred embodiments of the invention which are described below in conjunction with the accompanying drawings.

DETAILED DESCRIPTION OF THE PREFERRED EMBODIMENTS

Figure 1A:
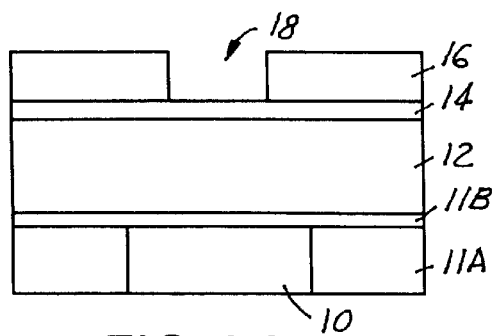
FIGS. 1A–1G are representative cross sectional side views of a portion of a semiconductor wafer including a dual damascene structure at stages in the manufacturing process according to the present invention.

Although the present invention is explained with reference to a dual damascene process, it will be appreciated that the present invention may be adapted to the formation of any anisotropically etched semiconductor, where the photolithographic patterning of a second feature overlying the first feature advantageously avoids the accumulation of undeveloped photoresist contamination within the underlying first feature including at least a sidewall portion.

In a first embodiment of the present invention, a first anisotropically etched semiconductor feature opening formed in a dielectric insulating layer is provided. A polymeric resinous layer is blanket deposited over the insulating layer to fill the anisotropically etched semiconductor feature including a curing process. The excess polymeric resinous layer is then subjected to a chemical mechanical polishing (CMP) process to remove the polymeric resinous layer to the semiconductor feature opening level. A second semiconductor feature is then photolithographically patterned for anisotropic etching overlying and encompassing the first anisotropically etched semiconductor. feature In one embodiment according to the present invention, the semiconductor feature opening is a via opening. For example, the via opening is created as a step in a via first dual damascene process whereby a trench opening is subsequently formed overlying and encompassing the via opening, the trench opening being anisotropically etched to include etching a portion of the via opening.

In other embodiments, the dielectric insulating layer also referred to as an inter-metal dielectric (IMD) layer includes at least an overlying dielectric anti-reflectance coating (DARC) layer. For example, the DARC layer is preferably silicon oxynitride (e.g., SiON) but may include other nitride DARC layers such as titanium nitride (e.g., TiN). Less preferably, the DARC layer may include an underlying etching stop layer, for example, formed of silicon nitride or silicon carbide. Also less preferably, the DARC layer may include an underlying silicon dioxide capping layer, for example, formed of TEOS by a conventional PECVD method to block nitrogen containing species diffusion into the IMD layer originating from overlying nitride layers including the DARC layer. Such silicon dioxide capping layers are less preferred since they increase the overall capacitance of the semiconductor device.

Preferably, the CMP process removes the polymeric resinous layer to the via opening level, in other words, the CMP process reveals the DARC layer. Preferably, following the oxide CMP process the via opening remains substantially filled with the polymeric resin. By the term 'substantially filled', is meant the via opening is at least 90 percent filled. More preferably, the semiconductor feature is completely filled, neglecting CMP dishing effects at the central portion of the opening.

Preferably the CMP process is a conventional oxide CMP process. For example, an oxide polishing slurry, for example, includes abrasive particles having at least one of silica ($SiO_2$), alumina ($Al_2O_3$), ceria ($CeO_2$), titania ($TiO_2$), manganese oxide ($MnO_2$), and zirconia ($ZrO_2$). Typically, the abrasive content of the slurry is about 1 weight percent to about 20 weight percent, more preferably, about 5 to about 10 weight percent. Further, the metal oxides typically have a mean particle diameter (i.e., meaning primary particles and agglomerates of primary particles) ranging from about 20 nanometers to about 500 nanometers, more preferably, about 100 to about 300 nanometers. For example, some slurry mixtures require appropriate surfactant additives to inhibit particle agglomeration as is known in the art. In an exemplary embodiment of the invention, for example, using a typical silica slurry, the material removal rate of the polymeric resinous layer was about 56,000 Angstrom per minute while the removal rate of an underlying silicon oxynitride DARC layer was from about 500 to about 600 Angstroms per minute thereby providing good CMP selectivity contrast to prevent DARC layer overpolishing.

For example, in an exemplary embodiment, referring to FIG. 1A–1G, are shown cross sectional side views of a portion of a multi-level semiconductor device at stages in manufacturing a dual damascene structure. Referring to FIG. 1A is shown is a conductive region 10, for example, copper, formed in a dielectric insulating layer 11A having an overlying etching stop layer 11B, for example silicon nitride or silicon carbide. The etching stop layer is formed by a conventional chemical vapor deposition (CVD) process including for example, PECVD (plasma enhanced CVD), LPCVD (low pressure CVD), or HDPCVD (high density plasma CVD) having a thickness of about 200 Angstroms to about 1000 Angstroms.

Formed over the etching stop layer 11B is insulating dielectric layer 12 also referred to as an inter-metal dielectric (IMD) layer formed of, for example, a low-k (low dielectric constant) carbon and/or fluorine doped silicon dioxide as is known in the art. Typically, the dielectric constant of the IMD layer is less than about 3.0. It will be appreciated that a silicon dioxide layer, formed by for example, a PECVD process using Tetra-ethyl-orthosilicate (TEOS) may be first formed over the etching stop layer prior to forming of the IMD layer to block diffusion of nitrogen containing species into the IMD layer, but is not a most preferred method since the added silicon dioxide layer undesirably increases the overall capacitance. In addition, the method of the present invention advantageously makes the formation of such capping or blocking layers unnecessary since the via opening is formed with a polymeric resinous material substantially filling the via opening thereby blocking out diffusion of any contaminating nitrogen species, such as amines, from the IMD layer to interfere with photoresist in a photolithographic patterning process.

It will be appreciated that other low-k materials may be used for the IMD layer and that the method according to the present invention is likewise applicable to those materials where the materials include interconnecting pores such that amide or amine contain species may diffuse therethrough. For example, the interconnecting pores have a mean diameter of greater than about 3 Angstroms. Exemplary low-k inorganic materials include, for example, porous oxides, xerogels, or SOG (spin-on glass). For example the IMD layer is formed having a thickness of from about 3000 Angstroms to about 10000 Angstroms by a conventional plasma enhanced chemical vapor deposition process (PECVD), HDP-CVD, or spin on process for SOG.

A metal nitride etching stop layer 14 also preferably functioning as a dielectric anti-reflectance coating (DARC) to reduce undesired light reflections in subsequent photolithographic patterning processes, is deposited over the IMD layer 12. The etching stop/DARC layer 14 is preferably formed of silicon oxynitride (e.g., SiON) but may include other nitride DARC materials such as titanium nitride. The silicon oxynitride layer 14 is deposited by a conventional chemical vapor deposition (CVD) process including for example, PECVD (plasma enhanced CVD), LPCVD (low pressure CVD), or HDPCVD (high density plasma CVD) by reacting silane ($SiH_4$) and nitrogen, including nitrogen containing precursors, with oxygen under conditions that are well known in the art. It will be appreciated that a separate etching stop layer overlying the IMD layer 12, for example, silicon nitride (e.g., $Si_3N_4$) together with an overlying DARC layer of silicon oxynitride may also be suitably used in place of a silicon oxynitride etching stop layer 14, however a single silicon oxynitride layer is more preferable to minimize capacitance contributions and processing cycles. The silicon oxynitride layer 14 is preferably formed having a thickness of about 200 to about 1000 Angstroms.

Still referring to FIG. 1A, a photoresist layer 16 is next deposited over the etching stop layer 14 and exposed and developed according to a conventional photolithographic patterning process to form an anisotropic etching pattern for via openings, for example, via opening pattern 18. Preferably, a deep ultraviolet (DUV) photoresist is used for patterning the via openings including an activating radiation source with a wavelength of less than about 250 nm, for example, from about 193 nm to about 250 nm, to expose the photoresist layer 16. The photoresist layer 16 may be any conventional DUV photoresist layer including a bi-layer photoresist including, for example, a chemically amplified resist including a photogenerated acid. There are several suitable commercially available DUV photoresists known in the art.

Figure 1B:
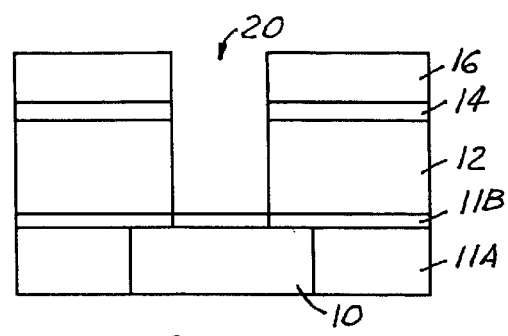

Referring to FIG. 1B, via opening 20 is anisotropically etched through the thickness of the etching stop/DARC layer 14, the IMD layer 12, and the etching stop layer 11B to create via opening 20 in closed communication with underlying conductive region 10. The anisotropic etching is carried out by conventional plasma reactive ion etch (RIE) processes including for example, mixtures of hydrofluorocarbons, fluorocarbons, oxygen, and nitrogen.

Figure 1C:
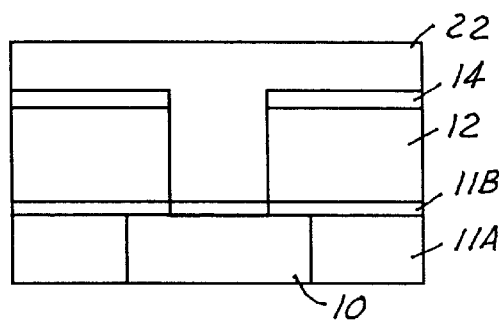

Referring to FIG. 1C, after removing the photoresist layer 16 by either a wet chemical stripping process or preferably a plasma ashing process including oxygen as is known in the art, a curable polymeric resinous layer 22, preferably an I-line resin such as a novolac resin, is blanket deposited, for example by a conventional spin-coating process, over the etching stop layer 14 to fill the via opening 20. By the term 'curable' is meant a polymer including at least one of a photosensitive and thermal agent for initiating polymeric cross-linking reactions. Most preferably, the curable polymeric resin is an I-line novolac resin. Preferably, the curable polymeric resin has a weight average molecular weight of from about 10,000 to about 90,000 to provide increased resistance to nitrogen-containing species diffusion across the via sidewalls and to give increased dimensional stability in a subsequent CMP process.

Figure 1D:
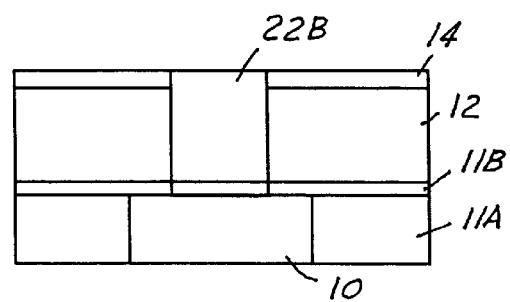

Referring to FIG. 1D, following blanket deposition, the polymeric resinous layer 22 is preferably subjected to a curing process including for example, a conventional thermal curing process at temperatures for example, from about 100° C. to about 160° C. to initiate polymer cross-linking. It will be appreciated that the curing time will depend on the polymeric resin and thermal sensitizing agent for initiating polymeric cross linking reactions. For example, for an I-line novolac resin, a thermal curing time of from about 5 minutes to about 20 minutes at temperatures from about 100° C. to about 160° C. is a suitable thermal curing process. The curing process may optionally include a photocuring process, the wavelength and time of exposure depending on the photosensitive curing agent included in the polymeric resin. It will be appreciated that other polymeric resins may be used, for example, including at least one of aliphatic urethane acrylates; aliphatic urethane diacrylates; aliphatic urethane triacrylates; hexafunctional aliphatic urethane acrylates; hexafunctional aromatic urethane acrylates; trifunctional aromatic urethane acrylates, aromatic urethane acrylates; urethane methacrylates; epoxy acrylates; epoxy methacrylates; polybutadiene dimethylacrylates; diacrylates of bisphenol-A epoxy resins; modified bisphenol-A epoxy acrylate resins; novolac epoxy acrylates; modified epoxy acrylates; partially acrylated bisphenol-A epoxy resins; bisphenol-A epoxy diacrylates; polyester resins; cycloaliphatic epoxide resins; modified cycloaliphatic epoxides; aliphatic polyols; partially acrylated bisphenol-A epoxy resins; and cycloaliphatic diepoxides.

In one embodiment of the present invention, following curing of the polymeric resinous layer 22, a CMP process is carried out to remove the excess polymeric resinous layer 22 overlying the via opening level to reveal the DARC layer and form via plug 22B substantially filling the via opening 20. Preferably, a conventional oxide CMP process as outlined above is performed. Preferably, the CMP process is carried out at least to endpoint detection. For example, suitable endpoint detection means include real-time optical detection methods including wafer polishing surface reflectance measurements, as well as laser interferometry. In addition, methods such as polishing pad motor load monitoring, or monitoring the electrical potential of the polishing effluent may be suitably used for endpoint detection. Optionally, a second curing process including at least one of a thermal and photo curing process may be carried out following the CMP process.

Figure 1E:
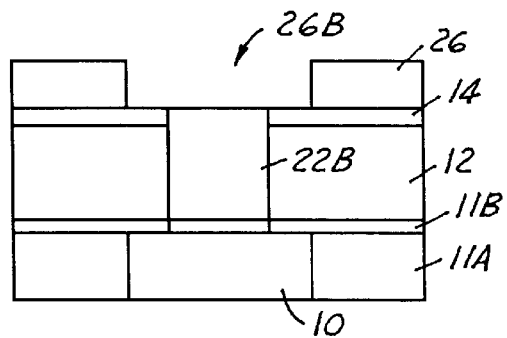

Referring to FIG. 1E, following via plug formation, a photoresist layer 26 (trench line photoresist) is deposited over the etching stop/DARC layer 14 and photolithographically patterned by exposure and development to form a trench opening pattern 26B for anisotropically etching a trench line opening overlying and encompassing via plug 22B. Preferably the photoresist is a DUV photoresist designed for exposure at a wavelength less than about 250 nm, for example about 193 nm to about 250 nm, as discussed with reference to via photoresist layer 16 in FIG. 1A.

Figure 1F:
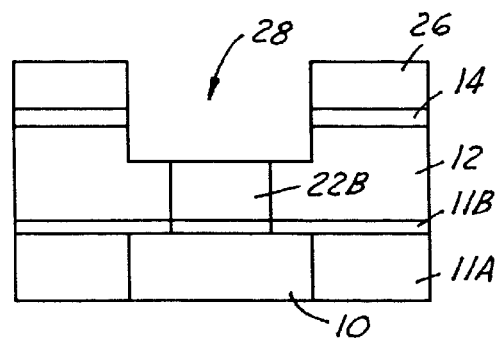

Referring to FIG. 1F, a conventional anisotropic etching process (e.g., RIE) is then carried out to first etch through the etching stop/DARC layer 14. According to another embodiment of the present invention, an RIE process having a fluorine rich plasma etching chemistry, preferably using a plasma with a carbon to fluorine ratio of at least about 4, is used to anisotropically etch through a thickness portion of the IMD layer 12 including etching through a portion of via plug 22B to complete the formation of trench opening 28. The fluorine rich etching chemistry is used to minimize additional formation of polymeric residues on the trench opening and via sidewalls.

Figure 1G:
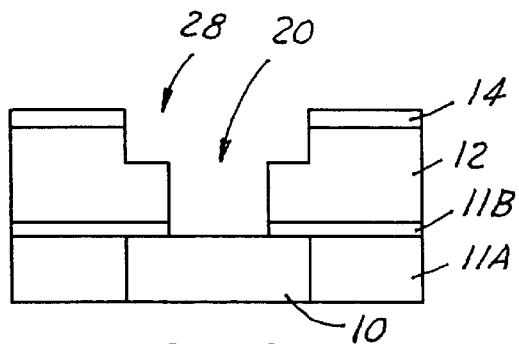

Referring to FIG. 1G, following the trench line etching process, the trench line opening is completed by removing the trench line photoresist layer 26 and remaining via plug 22B from the via opening 20 to form the via portion 20 and trench line portion 28 of the dual damascene structure. Preferably, a conventional plasma ashing process in an oxygen containing plasma is used; however, a wet chemical striping process as is known in the art may be suitably used as well. The dual damascene structure is typically completed by forming an adhesion/barrier layer of for example, tantalum nitride (TaN)(not shown) over the floor and sidewalls of the trench line opening 28 and via opening 20 followed by filling with a metal, for example copper, and planarizing with a chemical mechanical polishing (CMP) process (not shown).

Figure 2:
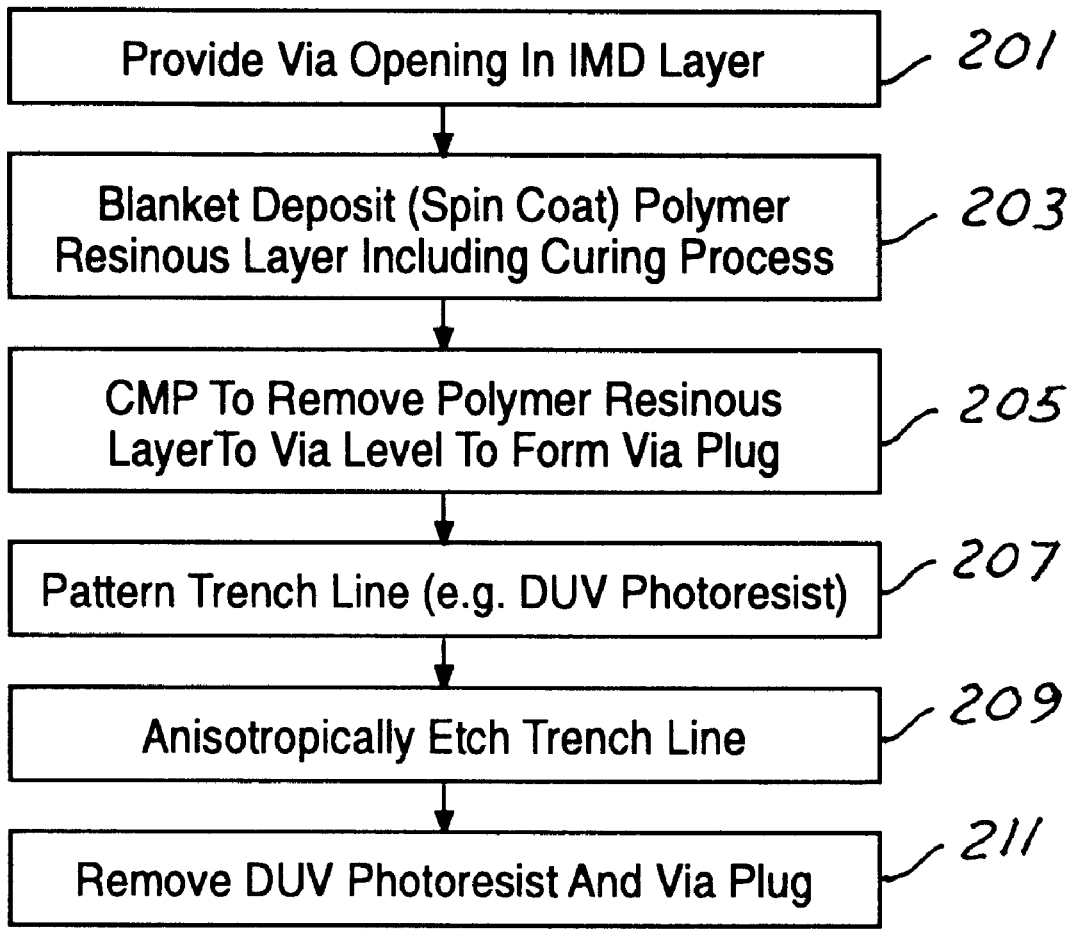
FIG. 2 is a representative process flow diagram including embodiments of the present invention.

Referring to FIG. 2, is shown a process flow diagram including several embodiments of the present invention. It will be understood that whenever reference herein is made to the singular of a semiconductor feature, for example, a via opening, that such reference includes a plurality of structures included in a semiconductor wafer. In addition it will be understood that multi-levels of semiconductor features are formed in sequential order to form a multi-level semiconductor device, thereby requiring repeating the process steps a number of times to complete formation of a semiconductor device.

According to several embodiments of the present invention, included in process 201, a first anisotropically etched opening in an insulating dielectric layer, for example a via opening in a via first dual damascene process, is provided. In process 203, a polymeric resinous layer, is blanket deposited to fill the via opening followed by a thermal curing process to initiate polymer cross-linking. In process 205 the polymeric resinous layer above the via level is removed by a CMP process to reveal the DARC layer and form a via plug substantially filling the via opening. In process 207 a DUV photoresist layer is provided over the via opening, for example, a chemically amplified photoresist, and photolithographically patterned for anisotropically etching a second semiconductor feature, for example, a trench line opening overlying and encompassing the via opening.

In process 209, a trench line opening is anisotropically etched through the etching stop/DARC layer and a thickness portion of the dielectric insulating layer (IMD layer) the etching chemistry for etching through the IMD layer preferably including a fluorine rich etching chemistry.

In process 211, the DUV photoresist layer including the via plug is removed according to at least one of a conventional plasma ashing process or a conventional wet chemical stripping process.

The dual damascene structure is then completed by conventional processes (not shown) including, for example, depositing an adhesion/barrier layer and filling the dual damascene structure with a metal, for example copper, followed by a metal CMP process to remove excess material above the etching stop layer.

Thus, the method according to the present invention provides a method whereby a photolithographic patterning process in, for example, forming a dual damascene structure may be reliably carried out without the detrimental effects of photoresist poisoning caused by undeveloped photoresist remaining on semiconductor features. In one embodiment, the method of the present invention prevents the formation of etching resistant polymeric residue including photoresist on the sidewalls of via openings thereby detrimentally affecting the formation of an overlying trench feature. The formation of the via plug substantially filling the via opening according to a CMP planarization process according to an embodiment of the present invention operates to block the out diffusion of nitrogen containing photoresist contaminating species to interfere with subsequent trench line patterning and anisotropic etching. In contrast with the prior art process of etching back the polymeric resinous layer to form the via plug, the difficulties of overetching and via sidewall damage are avoided. Further, the necessity of adding silicon dioxide capping layers to protect the IMD layer from contaminating nitrogen containing species is avoided thereby avoiding an increase to the overall capacitance of the device.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for improving a dual damascene etching process to block the out diffusion of nitrogen containing photoresist contaminating species to avoid photoresist poisoning in a semiconductor manufacturing process comprising the steps of:

providing a semiconductor wafer having a process surface including a via opening extending through a semiconductor wafer thickness portion including an uppermost dielectric anti-reflectance coating (DARC) layer and an underlying dielectric insulating layer to make closed communication with an underlying conductive region;

blanket depositing a polymeric resinous layer over the DARC layer to include filling the via opening;

curing the polymeric resinous layer by exposing the polymeric resinous layer to at least one of thermal or photonic energy to initiate polymer cross linking;

chemically mechanically polishing (CMP) the polymeric resinous layer to substantially remove the polymeric resinous layer thickness above the via opening level to expose the DARC layer and form a via plug substantially filling the via opening;

forming a photolithographically patterned photoresist layer over the DARC layer; and, forming a trench line opening overlying and encompassing the via opening to form a dual damascene opening according to a plasma etching process while leaving at least a portion of the via plug in place.

2. The method of claim 1, wherein the DARC layer is selected from the group consisting of silicon oxynitride and titanium nitride.

3. The method of claim 1, wherein the polymeric resinous layer is an I-line novalac resin.

4. The method of claim 1, wherein the polymeric resinous layer is photo-inactive during the step of forming a photolithographically patterned photoresist layer.

5. The method of claim 1, wherein the photolithographically patterned photoresist layer comprises a DUV photoresist including a photogenerated acid photoactive to an activating source of radiation less than about 250 nm.

6. The method of claim 1, wherein the dielectric insulating layer has a dielectric constant of less than about 3.0 comprising a porous material having interconnecting pores.

7. The method of claim 1, further comprising the step of removing the photolithographically patterned photoresist layer and a remaining portion of the via plug according to at least one of a plasma ashing process and a wet chemical stripping process.

8. The method of claim 1, wherein the step of etching the trench opening comprises using a plasma having a carbon to fluorine ratio of at least about 4.

9. A method for blocking out diffusion of nitrogen containing photoresist contaminating species to improve trench patterning and etching in a dual damascene process comprising the steps of:

providing a semiconductor wafer having a process surface including a via opening extending through a semiconductor wafer thickness portion including an uppermost DARC layer and at least a portion of an underlying dielectric insulating layer;

blanket depositing a flowable polymeric resinous layer having an average molecular weight of from about 10,000 to about 90,000 over the DARC layer to include filling the via opening;

curing the flowable polymeric resinous layer by exposing the polymeric resinous layer to at least one of thermal or photonic energy to initiate polymer cross linking;

chemically mechanically polishing (CMP) the polymeric resinous layer according to an oxide CMP process to substantially remove the polymeric resinous layer thickness to expose the DARC layer and form a via plug substantially filling the via opening;

providing a photolithographically patterned photoresist layer over the process surface for etching a trench line opening overlying and encompassing the via opening;

etching the trench opening according to a plasma etching process to extend through the DARC layer and a thickness portion of the dielectric insulating layer while leaving the via plug in place; and, removing the photolithographically patterned photoresist layer and the via plug according to at least one of a plasma ashing process and a wet chemical stripping process.

10. The method of claim 9, wherein the DARC layer includes at least one of silicon oxynitride and titanium nitride.

11. The method of claim 7, wherein the polymeric resinous layer includes an I-line novalac resin.

12. The method of claim 7, wherein the polymeric resinous layer includes at least one of aliphatic urethane acrylates; aliphatic urethane diacrylates; aliphatic urethane triacrylates; hexafunctional aliphatic urethane acrylates; hexafunctional aromatic urethane acrylates; trifunctional aromatic urethane acrylates, aromatic urethane acrylates; urethane methacrylates; epoxy acrylates; epoxy methacrylates; polybutadiene dimethylacrylates; diacrylates of bisphenol-A epoxy resins; modified bisphenol-A epoxy acrylate resins; novolac epoxy acrylates; modified epoxy acrylates; partially acrylated bisphenol-A epoxy resins; bisphenol-A epoxy diacrylates; polyester resins; cycloaliphatic epoxide resins; modified cycloaliphatic epoxides; aliphatic polyols; partially acrylated bisphenol-A epoxy resins; and cycloaliphatic diepoxides.

13. The method of claim 7, wherein the photolithographically patterned photoresist layer is photoactive to an activating source of radiation less than about 250 nm.

14. The method of claim 7, wherein the dielectric insulating layer has a dielectric constant of less than about 3.0 including interconnecting pores greater than about 3 Angstroms.

15. The method of claim 9, wherein the step of etching the trench opening comprises using a plasma having a carbon to fluorine ratio of at least about 4.

16. The method of claim 9, wherein the oxide CMP process comprises an oxide polishing slurry having an abrasive material selected from the group consisting of silica ($SiO_2$), alumina ($Al_2O_3$), ceria ($CeO_2$), titania ($TiO_2$), manganese oxide ($MnO_2$), and zirconia ($ZrO_2$).

17. The method of claim 16, wherein the abrasive material comprises about 1 weight percent to about 20 weight percent of the oxide polishing slurry.

18. The method of claim 9, wherein the oxide CMP process comprises endpoint detection of the DARC layer.

19. The method of claim 9, wherein a second curing process is carried out following the oxide CMP process.

* * * * *